US009850595B2

United States Patent
Hoshi et al.

(10) Patent No.: US 9,850,595 B2
(45) Date of Patent: Dec. 26, 2017

(54) METHOD FOR HEAT TREATMENT OF SILICON SINGLE CRYSTAL WAFER

(71) Applicant: SHIN-ETSU HANDOTAI CO., LTD., Tokyo (JP)

(72) Inventors: Ryoji Hoshi, Nishigo-mura (JP); Hiroyuki Kamada, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 15/107,050

(22) PCT Filed: Aug. 1, 2015

(86) PCT No.: PCT/JP2015/000046
§ 371 (c)(1),
(2) Date: Jun. 21, 2016

(87) PCT Pub. No.: WO2015/107874
PCT Pub. Date: Jul. 23, 2015

(65) Prior Publication Data
US 2017/0037541 A1 Feb. 9, 2017

(30) Foreign Application Priority Data
Jan. 16, 2014 (JP) ................. 2014-006237

(51) Int. Cl.
*H01L 21/322* (2006.01)
*C30B 33/02* (2006.01)
(Continued)

(52) U.S. Cl.
CPC .............. *C30B 33/02* (2013.01); *C01B 33/02* (2013.01); *C30B 29/06* (2013.01); *C30B 33/005* (2013.01);
(Continued)

(58) Field of Classification Search
CPC ......... C01B 33/02; C30B 15/00; C30B 29/06; C30B 33/005; C30B 33/02; H01L 21/3221; H01L 29/32
(Continued)

(56) References Cited

U.S. PATENT DOCUMENTS 6,048,395 A 4/2000 Iida et al.
6,129,787 A 10/2000 Adachi et al.
(Continued)

FOREIGN PATENT DOCUMENTS

JP H11-157996 A 6/1999
JP H11-260677 A 9/1999
(Continued)

OTHER PUBLICATIONS

Aug. 2, 2016 Japanese Office Action issued in Patent Application No. 2014-006237.
(Continued)

*Primary Examiner* — Mohammed Shamsuzzaman
(74) *Attorney, Agent, or Firm* — Oliff PLC

(57) ABSTRACT

A method for a heat treatment of a silicon single crystal wafer in an oxidizing ambient, including: performing the heat treatment based on a condition determined by a tripartite correlation between a heat treatment temperature during the heat treatment, an oxygen concentration in the silicon single crystal wafer before the heat treatment, and a growth condition of a silicon single crystal from which the silicon single crystal wafer is cut out. This provides a method for a heat treatment of a silicon single crystal wafer which can annihilate void defects or micro oxide precipitate nuclei in a silicon single crystal wafer with low cost, efficiently, and securely by a heat treatment in an oxidizing ambient.

6 Claims, 1 Drawing Sheet

(51) Int. Cl.
*C30B 29/06* (2006.01)
*H01L 29/32* (2006.01)
*C01B 33/02* (2006.01)
*C30B 33/00* (2006.01)
*C30B 15/00* (2006.01)

(52) U.S. Cl.
CPC .......... *H01L 21/3221* (2013.01); *H01L 29/32* (2013.01); *C30B 15/00* (2013.01)

(58) Field of Classification Search
USPC ............ 257/617, 618; 438/471, 795, 446, 5; 117/84
See application file for complete search history.

(56) References Cited

U.S. PATENT DOCUMENTS

| | | | |
|---|---|---|---|
| 6,334,896 B1* | 1/2002 | Iida | C30B 15/14 117/13 |
| 6,413,310 B1 | 7/2002 | Tamatsuka et al. | |
| 6,548,035 B1* | 4/2003 | Kimura | C30B 15/203 117/13 |
| 6,626,994 B1* | 9/2003 | Kimura | C30B 15/203 117/13 |
| 2002/0121238 A1* | 9/2002 | Falster | C30B 15/203 117/34 |
| 2003/0029375 A1* | 2/2003 | Watanabe | C30B 15/203 117/13 |
| 2003/0148634 A1* | 8/2003 | Holzl | C30B 29/06 438/795 |
| 2004/0244674 A1* | 12/2004 | Ono | C30B 15/04 117/19 |
| 2005/0081778 A1 | 4/2005 | Ando et al. | |
| 2005/0229842 A1* | 10/2005 | Umeno | C30B 29/06 117/84 |
| 2006/0005762 A1* | 1/2006 | Maeda | C30B 29/06 117/94 |
| 2006/0016387 A1* | 1/2006 | Yokoyama | C30B 15/14 117/84 |
| 2006/0027159 A1* | 2/2006 | Shibayama | C30B 29/06 117/19 |
| 2006/0075957 A1* | 4/2006 | Takeno | C30B 29/06 117/84 |
| 2006/0283379 A1* | 12/2006 | Inami | C30B 15/04 117/43 |
| 2007/0000427 A1* | 1/2007 | Umeno | H01L 21/3221 117/3 |
| 2007/0218570 A1* | 9/2007 | Nakamura | C30B 15/00 438/5 |
| 2009/0061140 A1* | 3/2009 | Sadohara | C30B 15/203 428/64.1 |
| 2009/0301385 A1* | 12/2009 | Kuroki | C30B 29/06 117/13 |
| 2010/0052103 A1* | 3/2010 | Umeno | C30B 15/203 257/607 |
| 2010/0127354 A1* | 5/2010 | Ono | C30B 15/14 257/618 |
| 2011/0052923 A1* | 3/2011 | Umeno | C30B 15/00 428/446 |
| 2011/0084366 A1* | 4/2011 | Nakai | C30B 15/02 257/629 |
| 2013/0264685 A1* | 10/2013 | Qu | C30B 29/06 257/617 |
| 2013/0323153 A1* | 12/2013 | Hoshi | G01N 21/47 423/348 |
| 2015/0147258 A1* | 5/2015 | Hong | C30B 15/00 423/348 |

FOREIGN PATENT DOCUMENTS

| | | |
|---|---|---|
| JP | 2000-272996 A | 10/2000 |
| JP | 2003-086595 A | 3/2003 |
| JP | 2004-161566 A | 6/2004 |
| JP | 2006-344823 A | 12/2006 |
| JP | 2008-135773 A | 6/2008 |
| JP | 2010-265143 A | 11/2010 |
| JP | 2012-153548 A | 8/2012 |
| JP | 2013-089783 A | 5/2013 |
| WO | 00/012786 A1 | 3/2000 |
| WO | 03/056621 A1 | 7/2003 |
| WO | 04/073057 A1 | 8/2004 |

OTHER PUBLICATIONS

Jul. 19, 2016 International Preliminary Report on Patentability issued in International Application No. PCT/JP2015/000046.
V. V. Voronkov, "The Mechanism of Swirl Defects Formation in Silicon," Journal of Crystal Growth, vol. 59, 1982, pp. 625-643.
F. Dupret et al., "Global modelling of heat transfer in crystal growth furnaces," Int. J. Heat Mass Transfer, vol. 33, 1990, pp. 1849-1871.
Apr. 7, 2015 International Search Report issued in International Application No. PCT/JP2015/000046.

* cited by examiner

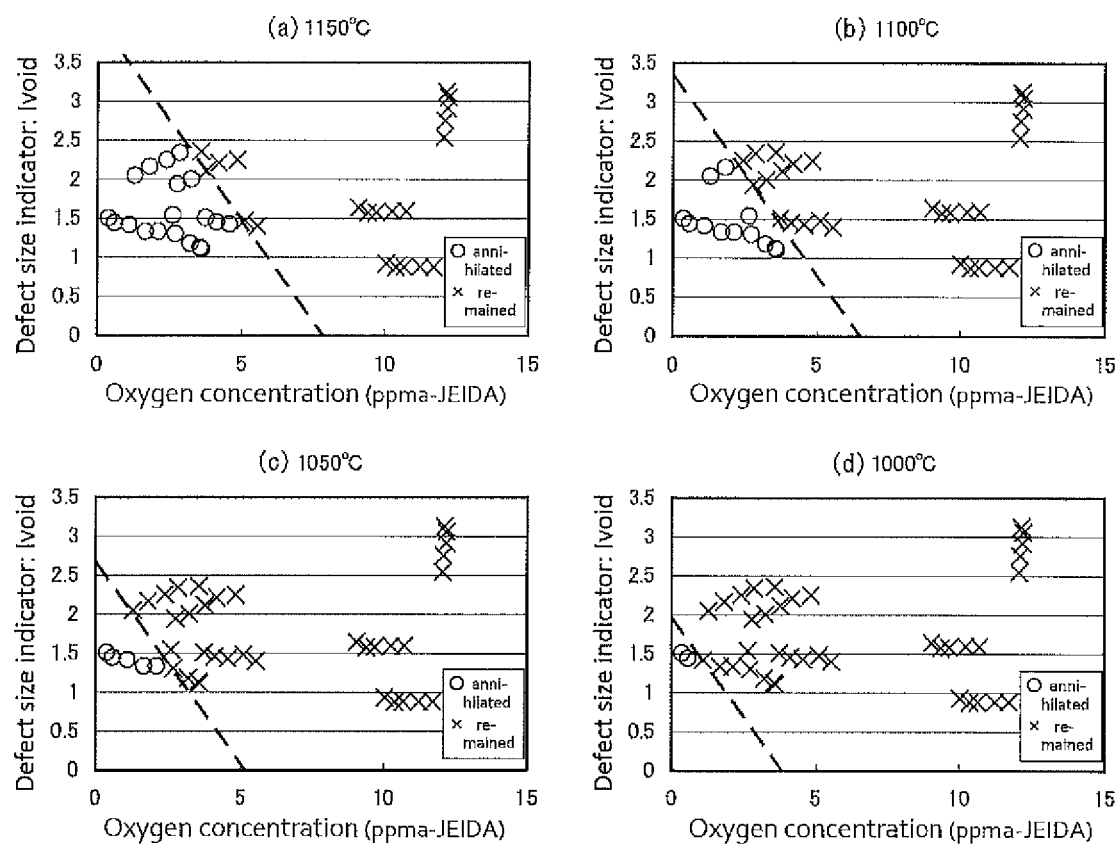

METHOD FOR HEAT TREATMENT OF SILICON SINGLE CRYSTAL WAFER

TECHNICAL FIELD

The present invention relates to a method for a heat treatment of a silicon single crystal wafer in an oxidizing ambient.

BACKGROUND ART

Recently, demand for improved quality of silicon (Si) single crystal wafers have been escalated due to high integration of devices. Herein, the improved quality means being free from defects in a device operation region. Many of conventional largely fabricated devices such as memories or logics operate in the vicinity of the surface of the wafer, and accordingly the vicinity of the surface has been made to be defect-free. These can be achieved by a wafer such as an epitaxial wafer, an anneal wafer, a PW (polished wafer) cut out from a defect-free crystal.

However, power devices are gaining attention recently in view of energy saving. When this device is made of Si crystal, there increases a case in which electricity is conducted in the direction of thickness of a wafer in order to conduct a large amount of electricity. Accordingly, it needs to annihilate defects not only in the vicinity of the surface, but also in the interior of a wafer. In order to achieve this, it is possible in epitaxial wafers to make the thickness of epitaxial layers equivalent to the thickness used as a device, for example. However, this is very expensive and unpractical. Accordingly, it is effective to grow a crystal free from grown-in defects and to cut out a wafer from the defect-free crystal which is entirely defect-free.

As grown-in defects, two types are known including a void defect of a vacancy type in which an Si atom at a lattice point is lacking and a dislocation cluster defect of an interstitial-Si (inter-lattice Si, hereinafter also referred to as I—Si) type in which an Si atom is interposed into a lattice. The state of forming the grown-in defects differs due to a growth rate of a single crystal or a cooling condition of a single crystal pulled from a silicon melt.

It is known that, for example, when a single crystal is grown by setting the growth rate relatively large, the vacancy type is predominant. The vacant defect formed by aggregation of this vacancy is called a void defect, and is detected as an FPD (Flow Pattern Defect), a COP (Crystal Originated Particle), or an LSTD (Laser Scattering Tomography Defect), although the name differs with the detecting method. It is considered that when these defects are introduced to an oxide film formed on the silicon substrate, for example, the electrical properties are degraded to cause a breakdown voltage failure of an oxide film and so on.

On the other hand, it is known that when a single crystal is grown by setting the growth rate relatively small, the I—Si is predominant. On an aggregation of this I—Si, an LEP (Large Etch Pit=dislocation cluster defect) is detected, in which the LEP is considered to be formed by clustering of a dislocation loop. It is said that when a device is formed on a region in which this dislocation cluster defect can be generated, a serious failure such as a current leakage occurs.

Accordingly, it is possible to obtain a defect-free region, in which a vacancy or I—Si is not contained or contained in a small amount so as not to form a void defect or a dislocation cluster defect, when a crystal is grown in an intermediate condition between the condition in which the vacancy is predominant and the condition in which the I—Si is predominant. As a method to obtain such a defect-free crystal, it has been proposed a method to control the temperature in a furnace or the growth rate as described in Patent Document 1. However, there is a problem of relatively low productivity since defect-free crystals generally have low growth rate.

There are various means to find a defect-free region in a CZ crystal, and one of them is an oxide precipitate. This is due to oxygen in a CZ silicon crystal to form oxide precipitate ($SiO_2$) through a heat treatment. The oxygen precipitation reaction has a tendency to be promoted under an existence of vacancy, and accordingly the oxide precipitate generates differently due to a defect region. This is utilized to find a defect region.

Recently, low oxygen products are highly demanded in various devices such as memories and logics as well as power devices and RI devices. This is because oxygen changes to a donor through a low temperature heat treatment to change the resistivity. Another reason is improving cleanliness of device processes, which does not require conventional gettering technology of heavy metal impurities by forming oxide precipitates in a wafer. On the other hand, the low oxygen concentration causes a problem in which the foregoing defect evaluation by oxide precipitates is difficult, thereby making it difficult to find a defect-free region.

One of the means to solve the foregoing problem in defect-free crystals is to grow a crystal in a vacancy-rich region, where the growth rate can be large. In this region, however, vacancies aggregate to generate a void defect. Accordingly, several technologies to annihilate these void defects has been disclosed previously.

Patent documents 2 and 3 disclose technologies to annihilate void defects by a non-oxidizing heat treatment and oxidation heat treatment. In these technologies, a non-oxidizing heat treatment is performed first so as to cause out-diffusing of oxygen in the vicinity of a wafer surface to dissolve inner wall oxide films of the inner-walls of vacant void defects. Then, an oxidation heat treatment is performed to implant I—Si from an oxide film formed on the surface into the interior of a wafer to fill void defects. Patent document 4 discloses a technology of an oxidation heat treatment and a non-oxidizing heat treatment, in which the order of the processes are reversed.

These technologies can annihilate void defects. These technologies, however, require two-step heat treatments, which causes high cost. As another problem, they can only eliminate void defects in the vicinity of a surface.

In addition, Patent Document 5 discloses a method of oxidation heat treatment at 1,300° C. This is a one-step heat treatment, but the temperature of 1,300° C. increases the difficulty, and causes problems of contamination of a water or generation of slip dislocation.

In the foregoing technologies, an influence of the oxygen concentration is not clarified. The influence of the oxygen concentration is described in Patent Document 6, for example. This technology increases the forms in which plural of void defects are linked together, and makes it easier to annihilate the void defects by a heat treatment thereby. In this technology, however, a non-oxidizing heat treatment is performed. This recommends to increase the oxygen concentration or reduce the cooling rate, which are contrary to an oxidation heat treatment described below.

On the other hand, Patent Document 7 discloses that void defects are annihilated only by treating at a relatively low temperature of 1,200° C. or less in an oxidation heat treatment when the oxygen concentration is low, and it is a known technology. This can be reasoned that the solid solubility limit (equilibrium concentration) of oxygen in a silicon crystal is approximately 8 ppma-JEIDA at 1,200° C., for example. When an oxygen concentration is lower than that, it is considered that inner wall oxide films of voids can be dissolved even when a non-oxidizing heat treatment is not performed unlike the foregoing Patent Document 2 and 3. At the same time, an oxide film is formed on the surface and I—Si is implanted, and accordingly it is possible to annihilate voids only by an oxidation heat treatment without requiring any particular process.

Applying this technology, Patent Document 8 discloses a technology to annihilate void defects by an oxidation heat treatment on a silicon wafer with low oxygen concentration. Patent Document 8, however, does not describe a void defect size or a crystal growth condition. Patent Document 9 discloses a similar technology and describes a relatively large void size as 100 nm, but does not mention a crystal growth condition and influence thereof. As described later, in a crystal growth condition such that the void size grows large, void defects are not fully annihilated by an oxidation heat treatment. Accordingly, these technologies cannot fully annihilate void defects. Moreover, the both of these technologies target for articles irradiated with neutron. The treatment temperature is relatively high and the treatment time is relatively long, which are considered to combine a recovery heat treatment. Accordingly, they have a problem regarding cost reduction, and also have problems of wafer contamination or generation of slip dislocation.

CITATION LIST

Patent Literature

Patent Document 1: Japanese Unexamined Patent publication (Kokai) No. H11-157996
Patent Document 2: Japanese Unexamined Patent publication (Kokai) No. H11-260677
Patent Document 3: WO 2000/012786
Patent Document 4: Japanese Unexamined Patent publication (Kokai) No. 2013-89783
Patent Document 5: WO 2003/056621
Patent Document 6: Japanese Unexamined Patent publication (Kokai) No. 2000-272996
Patent Document 7: WO 2004/073057
Patent Document 8: Japanese Unexamined Patent publication (Kokai) No. 2006-344823
Patent Document 9: Japanese Unexamined Patent publication (Kokai) No. 2010-265143

SUMMARY OF INVENTION

Problem to be Solved by the Invention

The present invention was accomplished to solve the foregoing problems. It is an object of the present invention to provide a method for a heat treatment of a silicon single crystal wafer which can annihilate void defects or micro oxide precipitate nuclei in a silicon single crystal wafer with low cost, efficiently, and securely by a heat treatment in an oxidizing ambient.

Means for Solving Problem

In order to solve the problems, the present invention provides a method for a heat treatment of a silicon single crystal wafer in an oxidizing ambient, comprising:

performing the heat treatment based on a condition determined by a tripartite correlation between a heat treatment temperature during the heat treatment, an oxygen concentration in the silicon single crystal wafer before the heat treatment, and a growth condition of a silicon single crystal from which the silicon single crystal wafer is cut out.

Such a heat treatment method can annihilate void defects or micro oxide precipitate nuclei in a silicon single crystal wafer with low cost, efficiently, and securely by a heat treatment in an oxidizing ambient.

In this case, preferably, the silicon single crystal wafer is cut out from a silicon single crystal without nitrogen-doping, and the tripartite correlation is represented by the following relational expression (A-1):

$$T \geq 37.5[Oi] + 72.7 \text{Ivoid}^A + 860 \quad \text{(A-1)}$$

wherein, "T" is the heat treatment temperature (° C.), [Oi] is the oxygen concentration (ppma-JEIDA) in the silicon single crystal wafer before the heat treatment, and Ivoid$^A$ is represented by the following formula (A-2):

$$\text{Ivoid}^A = \{(V/G) - (V/G)crt\}^{1/3} \times \{L(1150-1080)/V\}^{1/2} \quad \text{(A-2)}$$

wherein, "V" is a growth rate (mm/min), "G" is a temperature gradient near an interface (° C./mm), (V/G)crt is a value of V/G when a defect is nonexistent, L(1150–1080) is a length of a temperature zone of void-defect formation of 1,150° C. to 1,080° C. (mm).

It is also preferable that the silicon single crystal wafer be cut out from a silicon single crystal doped with nitrogen, and the tripartite correlation be represented by the following relational expression (B-1):

$$T \geq 37.5[Oi] + 72.7 \text{Ivoid}^B + 860 \quad \text{(B-1)}$$

wherein, "T" is the heat treatment temperature (° C.), [Oi] is the oxygen concentration (ppma-JEIDA) in the silicon single crystal wafer before the heat treatment, and Ivoid$^B$ is represented by the following formula (B-2):

$$\text{Ivoid}^B = \{(V/G) - (V/G)crt\}^{1/3} \times \{L(1080-1040)/2V\}^{1/2} \quad \text{(B-2)}$$

wherein, "V" is a growth rate (mm/min), "G" is a temperature gradient near an interface (° C./mm), (V/G)crt is a value of V/G when a defect is nonexistent, L(1080–1040) is a length of a temperature zone of void-defect formation of 1,080° C. to 1,040° C. (mm) when the single crystal is doped with nitrogen.

It is possible to annihilate void defects securely by setting the heat treatment temperature, the oxygen concentration, and the growth condition so as to satisfy each relational expression when using either wafer cut out from a silicon single crystal without nitrogen-doping or cut out from a silicon single crystal doped with nitrogen.

In this case, the silicon single crystal wafer is preferably cut out from a silicon single crystal doped with nitrogen at a concentration of $5 \times 10^{15}$ atoms/cm$^3$ or less.

Although void defects are annihilated by satisfying the foregoing condition even when nitrogen is not doped, nitrogen-doped ones can improve durability to slip dislocation and can reduce void sizes.

In this case, the silicon single crystal wafer is preferably cut out from a silicon single crystal without a defect due to Interstitial-Si.

By using such a silicon single crystal wafer, it is possible to obtain a defect-free silicon single crystal wafer in which a defect due to Interstitial-Si is not contained and void defects are annihilated by the heat treatment of the present invention.

In this case, the heat treatment temperature is preferably 900° C. or more and 1,200° C. or less, and a heat treatment time is preferably 1 minute or more and 180 minutes or less.

Such a heat treatment temperature can annihilate void defects with sizes to affect to the electrical properties, and can suppress a generation of slip dislocation.

Moreover, such a heat treatment time is sufficient to annihilate void defects, and can suppress an increase in cost.

In this case, the oxygen concentration of the silicon single crystal wafer is preferably 8 ppma-JEIDA or less.

By such an oxide concentration, it is possible to lower the heat treatment temperature which is needed to annihilate void defects, thereby being able to reduce the cost and to suppress a generation of slip dislocation during a heat treatment, which is liable to generate as the temperature gets high.

In this case, the thickness of the silicon single crystal wafer is preferably 0.1 mm or more and 20 mm or less.

By such a thickness, it is possible to retain the shape of a wafer easily, and the heat treatment time is not prolonged too long, thereby being able to suppress an increasing in cost.

Effect of Invention

As described above, the inventive method for a heat treatment of a silicon single crystal wafer can annihilate void defects or micro oxide precipitate nuclei in a silicon single crystal wafer, suppressing a generation of slip dislocation, with low cost, efficiently, and securely by a heat treatment in an oxidizing ambient.

Moreover, by using a wafer without a defect due to I—Si, it is possible to obtain a defect-free silicon single crystal wafer which does not contain a crystal defect due to either void or I—Si. Such a wafer is particularly suitable for a defect-free wafer used for a substrate of a semiconductor device such as a memory, a CPU, and a power device.

BRIEF DESCRIPTION OF DRAWINGS

FIG. 1 shows graphs to plot conditions of void defect annihilation by the heat treatment at each temperature ((a): 1,150° C., (b): 1,100° C., (c): 1,050° C., (d): 1,000° C.) in [Experiment], wherein the conditions are plotted on each graph with respect to the oxygen concentration and the Ivoid.

DESCRIPTION OF EMBODIMENTS

As described above, it has been required to develop a method for a heat treatment which can annihilate void defects or micro oxide precipitate nuclei in a silicon single crystal wafer with low cost, efficiently, and securely by a heat treatment in an oxidizing ambient.

It is known from Patent Document 7 that the heat treatment temperature and the oxygen concentration in a wafer relate to whether void defects are annihilated or not by an oxidation heat treatment. The inventors have diligently investigated to reveal that an oxidation heat treatment condition which can annihilate void defects is actually related to a growth condition of a single crystal from which the wafer is cut out in addition to the heat treatment temperature and the oxygen concentration. The inventors have accordingly found that the foregoing subject can be achieved by performing a heat treatment based on a condition determined by a tripartite correlation thereof; thereby brought the present invention to completion.

Thus the present invention is a method for a heat treatment of a silicon single crystal wafer in an oxidizing ambient, comprising:

performing the heat treatment based on a condition determined by a tripartite correlation between a heat treatment temperature during the heat treatment, an oxygen concentration in the silicon single crystal wafer before the heat treatment, and a growth condition of a silicon single crystal from which the silicon single crystal wafer is cut out.

Hereinafter, the present invention will be described in detail, but the present invention is not limited thereto.

In the present specification, the wording "an oxygen concentration" indicates "an oxygen concentration in the silicon single crystal wafer before the heat treatment", and the wording "a crystal growth condition" indicates "a growth condition of a silicon single crystal from which the silicon single crystal wafer is cut out."

In addition, when the Ivoid$^A$ and the Ivoid$^B$ are not distinguished, they are also described as "Ivoid" simply.

As described later, the conditions to annihilate void defects were determined by experiments to alter the heat treatment temperature, the heat treatment time in oxidation heat treatments, the oxygen concentration, and the growth condition on various samples. It has found that whether void defects are annihilated or not depends on the heat treatment temperature, the oxygen concentration, and the crystal growth condition.

The foregoing experiments have also revealed that void defects are likely to be annihilated when the heat treatment temperature is high, and likely to be annihilated when the oxygen concentration is low or the void size is small. On the other hand, it was not largely influenced by the heat treatment time. This can be reasoned that an I—Si diffuses into the interior of a wafer in several minutes since the diffusion constant of an I—Si is relatively large. Accordingly, it is very effective to perform a heat treatment based on a condition determined by the tripartite correlation between a heat treatment temperature, an oxygen concentration, and a crystal growth condition.

The tripartite correlation can be concretely represented by the following numerical formula:

$$T \geq 37.5[Oi] + 72.7 I\text{void} + 860 \tag{1}$$

This formula is transformed to the following formulae with representing [Oi] and Ivoid:

$$[Oi] \leq 0.0267T - 1.94 I\text{void} - 22.9 \tag{2}$$

$$I\text{void} \leq 0.0138T - 0.516[Oi] - 11.8 \tag{3}$$

Wherein, "T" is the heat treatment temperature (° C.), [Oi] is the oxygen concentration (ppma-JEIDA) in the silicon single crystal wafer before the heat treatment, and Ivoid is the "defect size indicator" determined by the crystal growth condition to reflect the void size.

It is to be noted that, herein, "ppma-JEIDA" is used as a unit of an oxygen concentration, which is expressed in various units. This is transformed to "atoms/cm$^3$-ASTM'79", which is relatively widely used, as [Oi] (ppma-JEIDA)=[Oi]' (atoms/cm$^3$-ASTM'79)/(8×10$^{16}$). Accordingly, when "atoms/cm$^3$-ASTM'79" is used as a unit, the foregoing formulae (1) to (3) can be used with substituting [Oi]'/(8×10$^{16}$) for [Oi].

The foregoing formula (1) represents that a heat treatment is performed by setting the heat treatment temperature not less than the temperature determined by an oxygen concentration and a crystal growth condition; the foregoing formula (2) represents that the oxygen concentration is controlled not to exceed the concentration determined by a heat treatment temperature and a crystal growth condition; and the foregoing formula (3) represents that the crystal growth condition is controlled not to exceed the values determined by a heat treatment temperature and an oxygen concentration, respectively. Concretely, in the inventive heat treatment method, a heat treatment or control is performed so as to satisfy any of these.

In the following, Ivoid in the relational expression will be specifically explained.

As described above, it has been found by the experiments that an annihilation of void defects also depends on a crystal growth condition. By comparing conditions in which void defects are annihilated and crystal growth conditions, it has been found that void defects tend to be annihilated in crystal growth conditions such that the void size gets small. Accordingly, the inventors have inferred that it would be reasonable to express the void size by the condition in a crystal growth, thereby introducing a "defect size indicator: Ivoid" determined by a crystal growth condition and reflecting a void size.

On the basis of a theory of Grown-in defect in a silicon single crystal advocated first and advanced by Mr. Voronkov (see V. V. Voronkov; Journal of Crystal Growth, 59 (1982) 625 to 643), it is estimated that the amount of introduced vacancy is increased by larger V/G, which is a ratio of a crystal growth rate V (mm/min) and a temperature gradient at an interface of crystal growth G (° C./mm), and the amount of I—Si is increased when V/G is smaller. Accordingly, this V/G values were utilized in order to introduce Ivoid.

In a single crystal, it is known that there is a boundary between vacancy-rich region and I—Si-rich region, and the vicinity is defect-free. In the present invention, the V/G value at the boundary is defined as (V/G)crt and is utilized to introduce Ivoid. It is to be noted that in a condition of the present calculation, (V/G)crt is 0.180 mm²/(min·° C.).

It is considered that a void size is determined by vacancies introduced at high temperature and aggregated during passing through a temperature zone of defect formation. Accordingly, the amount of introduced vacancy is concisely determined as $\{(V/G)-(V/G)crt\}^{1/3}$. Herein, the reason for raising to the ⅓ power is that the value in which $\{(V/G)-(V/G)crt\}$ was raised to the ⅓ power was almost proportional to the amount of introduced vacancy separately determined by simulations of reactions occurring at high temperature such as slope diffusion.

Furthermore, √(Dt) is determined by assuming that the amount of aggregation in a temperature zone of void defect formation is proportional to the diffusion length √(Dt) in the corresponding area. Herein, the case of a single crystal without nitrogen-doping and the case of a single crystal doped with nitrogen are explained separately since they differ in the temperature zone of void-defect formation.

First, the case of a single crystal without nitrogen doing will be explained.

Without nitrogen-doping, the temperature zone of void-defect formation is 1,150° C. to 1,080° C. Accordingly, the diffusion length √(Dt) is determined as:

$$\sqrt{(Dt)} \propto \{L(1150-1080)/V\}^{1/2}$$

Wherein, "D" is a diffusion coefficient of a vacancy (which is a constant when the temperature is determined), "t" is a transit time, L(1150–1080) is a length of a temperature zone of void-defect formation of 1,150° C. to 1,080° C., and "V" has the same meaning as in the foregoing.

From the product of the diffusion length and the amount of introduced vacancy concisely determined, Ivoid$^A$ is determined as:

$$Ivoid^A = \{(V/G)-(V/G)crt\}^{1/3} \times \{L(1150-1080)/V\}^{1/2} \quad (A-2)$$

wherein, Ivoid$^A$ is an Ivoid when the single crystal is not doped with nitrogen.

Furthermore, this Ivoid$^A$ is applied to the foregoing formula (1) to obtain the following tripartite relational expression (A-1) between a heat treatment temperature, an oxygen concentration, and a crystal growth condition when the single crystal is not doped with nitrogen:

$$T \geq 37.5[Oi] + 72.7 Ivoid^A + 860 \quad (A-1)$$

Then, the case of a single crystal doped with nitrogen will be explained.

It is said that the temperature zone of void-defect formation is lowered to 1,080 to 1,040° C. with nitrogen-doping from 1,150 to 1,080° C. when a crystal is not doped with nitrogen. This vacancy diffusion coefficient of 1,080 to 1,040° C. is approximately half of the vacancy diffusion coefficient of 1,150 to 1,080° C. Accordingly, the diffusion length √(Dt) is determined as:

$$\sqrt{(Dt)} \propto \{L(1080-1040)/2V\}^{1/2}$$

Wherein, "D", "t", and "V" have the same meanings as in the foregoing, and L(1080–1040) is a length of a temperature zone of void-defect formation of 1,080° C. to 1,040° C.

From the product of the diffusion length and the amount of introduced vacancy concisely determined, Ivoid$^B$ is determined as:

$$Ivoid^B = \{(V/G)-(V/G)crt\}^{1/3} \times \{L(1080-1040)/2V\}^{1/2} \quad (B-2)$$

wherein, Ivoid$^B$ is an Ivoid when the single crystal is doped with nitrogen.

Furthermore, this Ivoid$^B$ is applied to the foregoing formula (1) to obtain the following tripartite relational expression (B-1) between a heat treatment temperature, an oxygen concentration, and a crystal growth condition when the single crystal is doped with nitrogen:

$$T \geq 37.5[Oi] + 72.7 Ivoid^B + 860 \quad (B-1)$$

As described above, it is possible to annihilate void defects securely by setting the heat treatment temperature, the oxygen concentration, and the crystal growth condition so as to satisfy each relational expression when using either wafer cut out from a silicon single crystal without nitrogen-doping or cut out from a silicon single crystal doped with nitrogen.

It is possible to judge whether void defects are annihilated or not from the crystal growth condition by using this relational expression without determining a size of a void defect in a grown crystal by various evaluation methods every time. Moreover, utilizing this correlation, it is possible to reduce the heat treatment temperature by controlling the oxygen concentration to relatively low value and controlling the crystal growth condition so as to make the void size relatively small, for example. If the heat treatment temperature can be lowered, it is possible to reduce the cost, and it is also possible to suppress a generation of slip dislocation during a heat treatment, which is liable to generate at higher temperature.

The silicon single crystal wafer used for the inventive heat treatment method is preferably cut out from a general crystal which is not intentionally doped with impurities except for a dopant to control the resistivity. This is because void defects can be annihilated as long as the oxygen concentration is so low as to satisfy the foregoing condition even when using a general crystal.

On the other hand, it is known that nitrogen-doping improves the durability to slip dislocation. Moreover, being doped with nitrogen, the defect-forming temperature zone is lowered, and the void sizes tend to small as described above. Accordingly, in the inventive heat treatment method, it is also preferable to use a silicon single crystal wafer cut out from a crystal which is intentionally doped with nitrogen in addition to a dopant to control the resistivity.

In this case, the doping amount of nitrogen is preferably $5 \times 10^{15}$ atoms/cm$^3$ or less. Since the solid solubility limit of nitrogen in a silicon crystal is said to be an order of the 15th power, it is possible to avoid the risk of dislocation generation in the crystal due to a nitrogen-doping with high-concentration by setting the concentration as in the foregoing. On the other hand, the nitrogen concentration does not have a lower limit. This is because the inventive heat treatment method can be used without any problem when nitrogen is not doped.

In calculating the foregoing defect size indicator Ivoid, however, it is preferable to treat the nitrogen concentration of $1 \times 10^{12}$ atoms/cm$^3$ or more as being doped with nitrogen. This is because the effect of nitrogen-doping such as lowering of a void size is brought at this concentration or more.

The inventive heat treatment method can annihilate void defects, but cannot annihilate defects due to I—Si. Accordingly, it is preferable to use a silicon single crystal wafer which is cut out from a silicon single crystal without a defect due to I—Si.

In a single crystal, OSF nuclei are generated in a region (OSF region) at the side with the growth rate lower than in a region in which void defects are generated. At the side with further low rate, there is a defect-free region. The defect-free region contains a region with many vacancy (Nv region) and a region with many I—Si (Ni region). The Nv region has a part which contains micro oxide precipitate nuclei. At the further low rate side, there is an I-rich region in which defects due to I—Si are generated.

It is considered that the inventive heat treatment method can also eliminate an OSF nucleus or a micro oxide precipitate nucleus. Accordingly, the inventive heat treatment method can be effectively applied to a silicon single crystal with any of the void defects generation region, the OSF region, the Nv region, and the Ni region, excluding the foregoing I-rich region.

That is, in the heat treatment method of the present invention, an improvement of the OSF region or the Nv region can also be expected not only an improvement of the void defects generation region. Accordingly, the inventive heat treatment method is effective against all regions which does not contain a defect due to I—Si.

In the inventive heat treatment method, the heat treatment temperature is preferably 900° C. or more and 1,200° C. or less. When the heat treatment temperature is 900° C. or more, it is possible to annihilate void defects with sizes which affect to the electrical properties. On the other hand, the heat treatment temperature of 1,200° C. or less enables to reduce the cost and to suppress a generation of slip dislocation. More preferably, the temperature is 1,150° C. or less, since it is possible to further suppress a generation of slip dislocation when the temperature is 1,150° C. or less.

The heat treatment time is preferably 1 minute or more and 180 minutes or less, although it depends on the thickness of a wafer to be used. As described above, the diffusion of I—Si is relatively fast and gives a diffusion length of nearly 1 mm, which is a thickness of a conventional wafer, in a minute. Accordingly, about 1 minute is enough for the heat treatment time. On the other hand, a heat treatment time more than 180 minutes is needless since a prolonged heat treatment time causes cost increase.

As a silicon single crystal wafer, it is preferable to use a wafer with an oxygen concentration of 8 ppma-JEIDA or less. This is because the solid solubility limit of oxygen at 1,200° C., which is the foregoing preferable heat treatment temperature, is approximately 8 ppma-JEIDA, and more increased oxygen concentration requires a treatment at a higher temperature. It is more preferable to use a wafer with an oxygen concentration of 6 ppma-JEIDA or less. This is because the solid solubility limit of oxygen at 1,150° C. is approximately 6 ppma-JEIDA, and it is possible to further suppress a generation of slip dislocation when the temperature is 1,150° C. or less. The oxygen concentration does not have a lower limit. As can be seen from the foregoing formulae, as the oxygen concentration is lower, it is possible to lower the heat treatment temperature required to annihilate void defects, and accordingly it is possible to reduce the cost and to suppress a generation of slip dislocation during a heat treatment, which is liable to generate at a higher temperature. The inventive heat treatment method can also be utilized to a wafer which is cut out from a crystal which hardly contains oxygen such as an FZ crystal not only a wafer cut out from a CZ crystal.

In the inventive heat treatment method, it is preferable to use a silicon single crystal wafer with a thickness of 0.1 mm or more and 20 mm or less. In the inventive heat treatment method, a thinner wafer does not bring any problem, however, the thickness of 0.1 mm or more is preferable since it enables to retain the wafer shape easily.

On the other hand, the heat treatment is preferably performed at 1,200° C. or less for 180 minutes or less in view of cost and so on as described above. The diffusion length of I—Si during a heat treatment at 1,200° C. for 180 minutes is approximately 10 mm. Since oxide films are formed on both of the front side and the back side, and I—Si is supplied therefrom, it is not possible to reform a wafer thickness beyond 20 mm or so when a heat treatment at 1,200° C. for 180 minutes is performed. Accordingly, it is preferable to use a wafer with the thickness of 20 mm or less in order to annihilate void defects in an entirety of the wafer within the foregoing heat treatment temperature and heat treatment time.

The state of the surface of a silicon single crystal wafer to be used for the inventive heat treatment method may be any surface state used in a producing process of a silicon wafer such as a polished surface, an etched surface, a lapped surface, a grinded surface, and a sliced surface. In the inventive heat treatment method, the surface state is not particularly concerned as long as an oxide film forms. Washing or so on is required to be put into a heat treatment furnace, but other particular surface treatment is not required. The heat treatment can be performed in any process of producing a wafer. Accordingly, the heat treatment may be performed in any surface state to be used in a production process of a silicon wafer.

The inventive heat treatment method is performed in an oxidizing ambient. The conditions such as an oxygen flow rate is not particularly limited as long as being an atmosphere which contains oxygen.

As described above, in the inventive method for a heat treatment of a silicon single crystal wafer, it is possible to annihilate void defects or micro oxide precipitate nuclei in a silicon single crystal wafer with low cost, efficiently, and securely while suppressing a generation of slip dislocation by a heat treatment in an oxidizing ambient.

Moreover, by using a wafer without a defect due to I—Si, it is possible to obtain a defect-free silicon single crystal wafer which does not contain a defect due to either void or I—Si. Such a wafer is particularly suitable for a defect-free wafer used for a substrate of a semiconductor device such as a memory, a CPU, and a power device.

EXAMPLE

The present invention will be more specifically described below with reference to Example and Comparative Example, but the present invention is not limited thereto.

EXPERIMENT

Each silicon single crystal with a diameter of a little over 200 mm or 300 mm was grown by using a CZ method or a magnetic field applied CZ (MCZ) method. In these cases, the crystals were grown with varying the oxygen concentration and the crystal growth condition. The oxygen concentration was controlled by altering the rotation number of a crystal, the rotation number of a crucible, the pressure in a furnace, and the Ar gas flow rate, which was flown in order to purge. On the other hand, the crystal growth condition was varied by altering the temperature gradient near an interface G and the length of a temperature zone of void-defect formation L(1150–1080) or L(1080–1040) with the structure of the parts in the furnace and/or controlling the growth rate V as well as an existence or nonexistence of nitrogen-doping. In this case, the crystal growth condition was adjusted in such a way that a defect due to I—Si was not contained.

This crystal was grinded cylindrically to process a cylindrical block with a desired diameter. Then, a wafer-form sample with a thickness of approximately 1.2 mm was cut out from the block. In this case, each three pieces of samples were cut out from adjacent positions per a part. One piece of these was used as a sample for measuring the oxygen concentration, and an existence or nonexistence of an FPD, an LEP, and an LSTD before a heat treatment (hereinafter referred as a "measure sample"). Other two pieces were actually subjected to the heat treatment as described below, and used as samples for measuring an FPD and an LSTD after the heat treatment (hereinafter referred as a "sample for heat treatment"). The samples were prepared with 35 of levels. In these levels, 5 levels were doped with nitrogen.

The measure samples were subjected to surface grinding to be high brightness, and then each oxygen concentration was measured by an FT-IR method. In these cases, the oxygen concentrations of the measure samples were within a range of 0.4 to 12.2 ppma-JEIDA (0.3 to $9.8 \times 10^{17}$ atoms/$cm^3$-ASTM'79). Furthermore, the measure samples were subjected to mirror etching by a mixed acid composed of hydrofluoric acid, nitric acid, and acetic acid. Then the measure samples were left in a selective etching liquid composed of hydrofluoric acid, nitric acid, acetic acid, and water to be subjected to selective etching without shaking. In each of these measure samples, FPDs were observed but an LEP was not observed, which confirmed that the defect due to I—Si was not contained.

Further, these measure samples were cleaved, and then LSTD was observed with an infrared scattering tomograph MO441 (product of Raytec Co., Ltd.). With MO441, each observation was performed to a depth of approximately 400 µm from the surface. It was confirmed that an LSTD was existent at this time.

Each temperature gradient near an interface G and length of a temperature zone of void-defect formation L(1150–1080) or L(1080–1040) were determined by calculating the crystal growth condition at the position from which the foregoing measure sample was cut out by a global heat transfer analysis software FEMAG (see F. Dupret et al.; Int. J. Heat Mass Transfer, 33, 1849 (1990)). In the FEMAG, calculations were performed by fixing the interface form as 10 mm. Each temperature gradient near an interface G was calculated from the melting point (=1,412° C.) to 1,400° C. From these and the growth rate V in a crystal growth, Ivoid when a crystal is not doped with nitrogen ($Ivoid^A$) was determined as $Ivoid^A$ $\{(V/G)-(V/G)crt\}^{1/3} \times \{L(1150-1080)/V\}^{1/2}$. As described above, among 35 levels of the measure samples, 5 levels were doped with nitrogen, and the concentration were 4 to $12 \times 10^{13}$ atoms/$cm^3$. Accordingly, Ivoid of these 5 levels of measure samples doped with nitrogen ($Ivoid^B$) were determined as $Ivoid^B=\{(V/G)-(V/G)\ crt\}^{1/3} \times \{L(1080-1040)/2V\}^{1/2}$. It is to be noted that (V/G)crt is a value of V/G when a defect is nonexistent, which was calculated as (V/G)crt=0.180 in the foregoing calculation condition.

Then, heat treatments were actually performed by using the foregoing samples for heat treatment.

First, two pieces of samples for heat treatment were subjected to surface grinding to be high brightness as a pretreatment for the heat treatment, and then each were divided in four and subjected to mirror etching with the foregoing mixed acid. After the etching, the samples for heat treatment were subjected to heat treatment in an oxidizing ambient of dry oxygen of 3 L/min. In these cases, the temperatures and the times of the heat treatments were set to the following 4×2=8 patterns: (a) at 1,150° C. for 30 minutes or 60 minutes, (b) at 1,100° C. for 30 minutes or 60 minutes, (c) at 1,050° C. for 60 minutes or 120 minutes, and (d) at 1,000° C. for 60 minutes or 120 minutes.

On the surfaces of the heat treated samples, oxide films were formed, and these were removed with hydrofluoric acid.

Then, the surfaces were subjected to mirror etching with the mixed acid, followed by selective etching to observe FPD in the same way as in the measure samples. In some of the samples, FPDs were disappeared compared to measure samples which were not subjected to heat treatment. Subsequently, these samples were cleaved, and then LSTD was observed with MO441. In this time, it was also confirmed in some samples that LSTDs were disappeared compared to measure samples which were not subjected to heat treatment.

Although they had surface state of etching faces, the defects were annihilated without any problem by an oxidation treatment. Basically, the same trend were observed between the cases in which FPDs were annihilated and the cases in which LSTDs were annihilated. However, FPDs tended to be annihilated easily. This can be reasoned that a wafer was observed through the interior thereof in an LSTD, while several tens µm from the surface was observed in an FPD. On the other hand, the heat treatment time hardly influenced whether defects were annihilated or not as a result of varying the heat treatment times with 2 levels in each heat treatment temperature.

The foregoing results are shown in FIG. 1 (a) to (d) in which the abscissa and ordinate represent the oxygen concentration and the Ivoid, respectively, by plotting as ° when the defects were annihilated and × when the defect remained. It is to be noted that the plotted results are results of LSTD when the heat treatment were performed for 60 minutes at each temperature.

It is found that the void defect is likely to annihilate as the oxygen concentration is lower or as the Ivoid is smaller from the conditions which annihilated void defects at each temperature of FIG. 1. It is also found that the defects are more difficult to be annihilated as the temperature falls from 1,150° C. to 1,000° C.

The process to annihilate a void defect is assumed that an oxide film of inner wall disappears first, and then I—Si fills the void defect. As described above, whether an oxide film of inner wall disappear or not is determined by whether the oxygen concentration is lower than the solid solubility limit of oxygen at the heat treatment temperature or not. That is, it is considered that the solid solubility limit of oxygen determines the temperature dependence whether the defects are annihilated or not.

Several solid solubility limits of oxygen are reported, and they are represented as $[Oi]=2.65\times10^4 \exp[-1.035/\{k(T+273)\}]$, for example. Wherein, "k" is the Boltzmann constant, which is $8.62\times10^{-5}$. By using this formula, the solid solubility limits of oxygen is about 6 ppma-JEIDA at 1,150° C. and about 2 ppma-JEIDA at 1,000° C. Accordingly, the following relation approximately holds between the temperature and the oxygen concentration in this temperature range: $T\propto37.5[Oi]$. On the basis of this, the condition under which void defects were annihilated in (a) to (d) of FIG. 1 is determined as $T\geq37.5[Oi]+72.7Ivoid+860$. This is transformed on the basis of the oxygen concentration to give $[Oi]\leq0.0267T-1.94Ivoid-22.9$, and transformed on the basis of the Ivoid to give $Ivoid\leq0.0139T-0.516[Oi]-11.8$.

From the foregoing experiments, it was found that the tripartite correlation between a heat treatment temperature, an oxygen concentration, and a crystal growth condition determines whether the void defects are annihilated or not by oxidation.

Among these, the crystal growth condition is easy to understand by expressing "Ivoid", which is an indicator to reflect a void size and is expressed by a product of $(V/G)-(V/G)crt\}^{1/3}$ corresponding to the amount of introduced vacancy and $\{L(1150-1080)/V\}^{1/2}$ or $\{L(1080-1040)/2V\}^{1/2}$ corresponding to the diffusion length in a temperature zone in which defects are formed.

Example 1

In the blocks prepared in the foregoing experiment, a wafer was cut out from the part of a block with a diameter of 300 mm, oxygen concentration of 3.2 ppma-JEIDA, and $Ivoid^A$ of 1.18 (V=0.66 mm/min, G=3.49° C./mm, L(1150–1080)=21.0 mm) without nitrogen-doping to produce a polished wafer (PW=polished side) with the thickness of 775 μm. The measured oxygen concentration [Oi] and determined $Ivoid^A$ were substituted to the relational expression to determine the required heat treatment temperature as follows:

$$T\geq37.5\times3.2+72.7\times1.18+860=1,066$$

On the basis of this determined heat treatment temperature, the wafer was subjected to a heat treatment at 1,150° C. for 30 minutes in an oxidizing ambient of dry oxygen of 3 L/min.

After the heat treatment, the oxide film was removed, and then the defect of this wafer was observed with MO441. As a result, no LSTD was detected.

Example 2

A crystal with a diameter of about 200 mm was grown by an MCZ method using a crystal pulling apparatus having the outer diameter of a crucible of about 660 mm. This crystal was doped with nitrogen. Two pieces of wafers with each thickness of 1.2 mm were cut out from adjacent positions in this crystal. The nitrogen concentration at which the wafers were cut out was $8\times10^{13}$ atoms/cm$^3$. One of the cut out wafers was subjected to double-side grinding, and then the oxygen concentration was measured by FT-IR to be 2.8 ppma-JEIDA. This measure wafer was subjected to mirror etching by a mixed acid composed of hydrofluoric acid, nitric acid, and acetic acid, followed by cleaving, and then observed with MO441 to find an LSTD.

The growth condition at which this measure wafer had been cut out was calculated by FEMAG as described above to reveal that the temperature gradient near an interface G ranging from the melting point to 1,400° C. was 3.17° C./mm, and the length of a temperature zone of void-defect formation L(1080–1040) was 13.8 mm. The growth rate V at which this wafer had been cut out was 0.90 mm/min. From the foregoing values, putting (V/G)crt=0.180, $Ivoid^B$ of this wafer was determined as follows:

$$Ivoid^B=\{(0.90/3.17)-0.180\}^{1/3}\times\{13.8/(2\times0.90)\}^{1/2}=1.30$$

The measured oxygen concentration [Oi] and $Ivoid^B$ determined as described above were substituted to the relational expression to determine the required heat treatment temperature as follows:

$$T\geq37.5\times2.8+72.7\times1.30+860=1,060$$

Another piece of cut out wafer was subjected to surface grinding, followed by mirror etching, and then subjected to a heat treatment at 1,100° C. for 30 minutes in an oxidizing ambient of dry oxygen of 3 L/min on the basis of the heat treatment temperature determined as the foregoing.

After the heat treatment, the oxide film was removed, and then the defect of this wafer was observed with MO441. As a result, no LSTD was detected.

Comparative Example 1

A crystal with a diameter of about 200 mm was grown by an MCZ method using a crystal pulling apparatus having the outer diameter of a crucible of about 660 mm. This crystal was doped with nitrogen. Two pieces of wafers with each thickness of 1.2 mm were cut out from adjacent positions in this crystal. The nitrogen concentration at which the wafers were cut out was $7\times10^{13}$ atoms/cm$^3$. One of the cut out wafers was subjected to surface grinding, followed by mirror etching, and then subjected to a heat treatment at 1,150° C. for 30 minutes in an oxidizing ambient of dry oxygen of 3 L/min without measuring the oxygen concentration and calculating the Ivoid.

After the heat treatment, the oxide film was removed, and then the defect of this wafer was observed with MO441. As a result, LSTDs were detected.

For confirmation, another piece of cut out wafer was subjected to double-side grinding, and then the oxygen concentration was measured by FT-IR to be 11.2 ppma-JEIDA. This measure wafer was subjected to mirror etching by a mixed acid composed of hydrofluoric acid, nitric acid, and acetic acid, followed by cleaving, and then observed with MO441 to detect very small LSTDs.

The growth condition at which this measure wafer had been cut out was calculated by FEMAG as described above to reveal that the temperature gradient near an interface G ranging from the melting point to 1,400° C. was 3.82° C./mm, and the length of a temperature zone of void-defect formation L(1080–1040) was 11.6 mm. The growth rate V at which this measure wafer had been cut out was 0.88 mm/min. From the foregoing values, putting (V/G)crt=0.180, Ivoid$^B$ of this wafer was determined as follows:

$$Ivoid^B = \{(0.88/3.82) - 0.180\}^{1/3} \times \{11.6/(2 \times 0.88)\}^{1/2} = 0.95$$

The measured oxygen concentration [Oi] and Ivoid$^B$ determined as described above were substituted to the relational expression to determine the required heat treatment temperature as follows:

$$T \geq 37.5 \times 11.2 + 72.7 \times 0.95 + 860 = 1,349$$

and the reason why the LSTD was not disappeared by a heat treatment at the heat treatment temperature of 1,150° C. was suggested that the heat treatment temperature determined by the correlation was not fulfilled.

From the foregoing, it was revealed that the inventive method for a heat treatment of a silicon single crystal wafer can annihilate void defects or micro oxide precipitate nuclei in a silicon single crystal wafer with low cost, efficiently, and securely by a heat treatment in an oxidizing ambient.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method for a heat treatment of a silicon single crystal wafer in an oxidizing ambient, comprising:
performing the heat treatment based on a condition determined by a tripartite correlation between a heat treatment temperature during the heat treatment, an oxygen concentration in the silicon single crystal wafer before the heat treatment, and a growth condition of a silicon single crystal from which the silicon single crystal wafer is cut out,
wherein
the silicon single crystal wafer is cut out from a silicon single crystal doped with nitrogen, and
the tripartite correlation is represented by the following relational expression (B-1):

$$T \geq 37.5[Oi] + 72.7Ivoid^B + 860 \quad (B-1)$$

wherein, "T" is the heat treatment temperature (° C.), [Oi] is the oxygen concentration (ppma-JEIDA) in the silicon single crystal wafer before the heat treatment, and Ivoid$^B$ is represented by the following formula (B-2):

$$Ivoid^B = \{(V/G) - (V/G)crt\}^{1/3} \times \{L(1080-1040)/2V\}^{1/2} \quad (B-2)$$

wherein, "V" is a growth rate (mm/min), "G" is a temperature gradient near an interface (° C./mm), (V/G)crt is a value of V/G when a defect is nonexistent, L(1080-1040) is a length of a temperature zone of void-defect formation of 1,080° C. to 1,040° C. (mm) when the single crystal is doped with nitrogen.

2. The method for a heat treatment of a silicon single crystal wafer according to claim 1, wherein the silicon single crystal wafer is cut out from a silicon single crystal doped with nitrogen at a concentration of $5 \times 10^{15}$ atoms/cm$^3$ or less.

3. The method for a heat treatment of a silicon single crystal wafer according to claim 1, wherein the silicon single crystal wafer is cut out from a silicon single crystal without a defect due to Interstitial-Si.

4. The method for a heat treatment of a silicon single crystal wafer according to claim 1, wherein the heat treatment temperature is 900° C. or more and 1,200° C. or less, and a heat treatment time is 1 minute or more and 180 minutes or less.

5. The method for a heat treatment of a silicon single crystal wafer according to claim 1, wherein the oxygen concentration of the silicon single crystal wafer is 8 ppma-JEIDA or less.

6. The method for a heat treatment of a silicon single crystal wafer according to claim 1, wherein the thickness of the silicon single crystal wafer is 0.1 mm or more and 20 mm or less.

* * * * *